US006274515B1

(12) United States Patent
Hughes et al.

(10) Patent No.: US 6,274,515 B1
(45) Date of Patent: Aug. 14, 2001

(54) SPIN-ON DIELECTRIC FORMATION PROCESS FOR USE IN MANUFACTURING SEMICONDUCTORS

(75) Inventors: Henry G. Hughes; Ping-Chang Lue, both of Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/037,849

(22) Filed: Mar. 29, 1993

Related U.S. Application Data

(63) Continuation of application No. 07/568,120, filed on Aug. 16, 1990, now abandoned.

(51) Int. Cl.$^7$ ................................................. H01L 21/312
(52) U.S. Cl. ............................................ 438/780; 438/623
(58) Field of Search ..................... 106/287.13, 287.16; 148/33.3; 437/231, 238, 243; 427/489; 438/623, 780, FOR 355

(56) References Cited

U.S. PATENT DOCUMENTS

| | | |
|---|---|---|
| 3,017,385 | 1/1962 | Sprung et al. . |
| 3,414,540 | 12/1968 | Nugent et al. . |
| 3,962,004 * | 6/1976 | Sonneborn . |
| 4,146,491 | 3/1979 | Vincent . |
| 4,626,556 * | 12/1986 | Nozue et al. .......................... 522/99 |
| 4,631,207 | 12/1986 | Price . |
| 4,676,867 | 6/1987 | Elkins et al. . |
| 4,732,858 * | 3/1988 | Brewer et al. . |
| 4,798,629 | 1/1989 | Wood et al. . |
| 4,885,262 * | 12/1989 | Ting et al. ............................ 437/231 |
| 4,950,583 * | 8/1990 | Brewer et al. ........................ 430/311 |
| 5,043,789 * | 8/1991 | Linde et al. ............................. 357/52 |
| 5,114,727 * | 5/1992 | Linde et al. ........................... 427/387 |
| 5,114,754 * | 5/1992 | Cronin et al. ......................... 427/333 |
| 5,152,834 * | 10/1992 | Allman ............................ 106/287.13 |
| 5,186,745 * | 2/1993 | Maniar ............................. 106/287.16 |
| 5,194,928 * | 3/1993 | Cronin et al. ........................ 257/629 |
| 5,278,451 * | 1/1994 | Adachi et al. ........................ 257/790 |

OTHER PUBLICATIONS

Brown J., et al, "Double Chain Polymers of Phenyl–Silsesquitone", J. Amer. Chem. Soc., vol. 82, pp. 6194–6195, Dec. 5, 1960.*

* cited by examiner

Primary Examiner—George Fourson
(74) Attorney, Agent, or Firm—Robert F. Hightower

(57) ABSTRACT

A spin-on dielectric for use in manufacturing semiconductors is produced. The dielectric is a siloxane polymer wherein each silicon atom is bonded to a polarization reducing group, and to three oxygen atoms each of which is bonded to one other silicon atom.

11 Claims, 1 Drawing Sheet

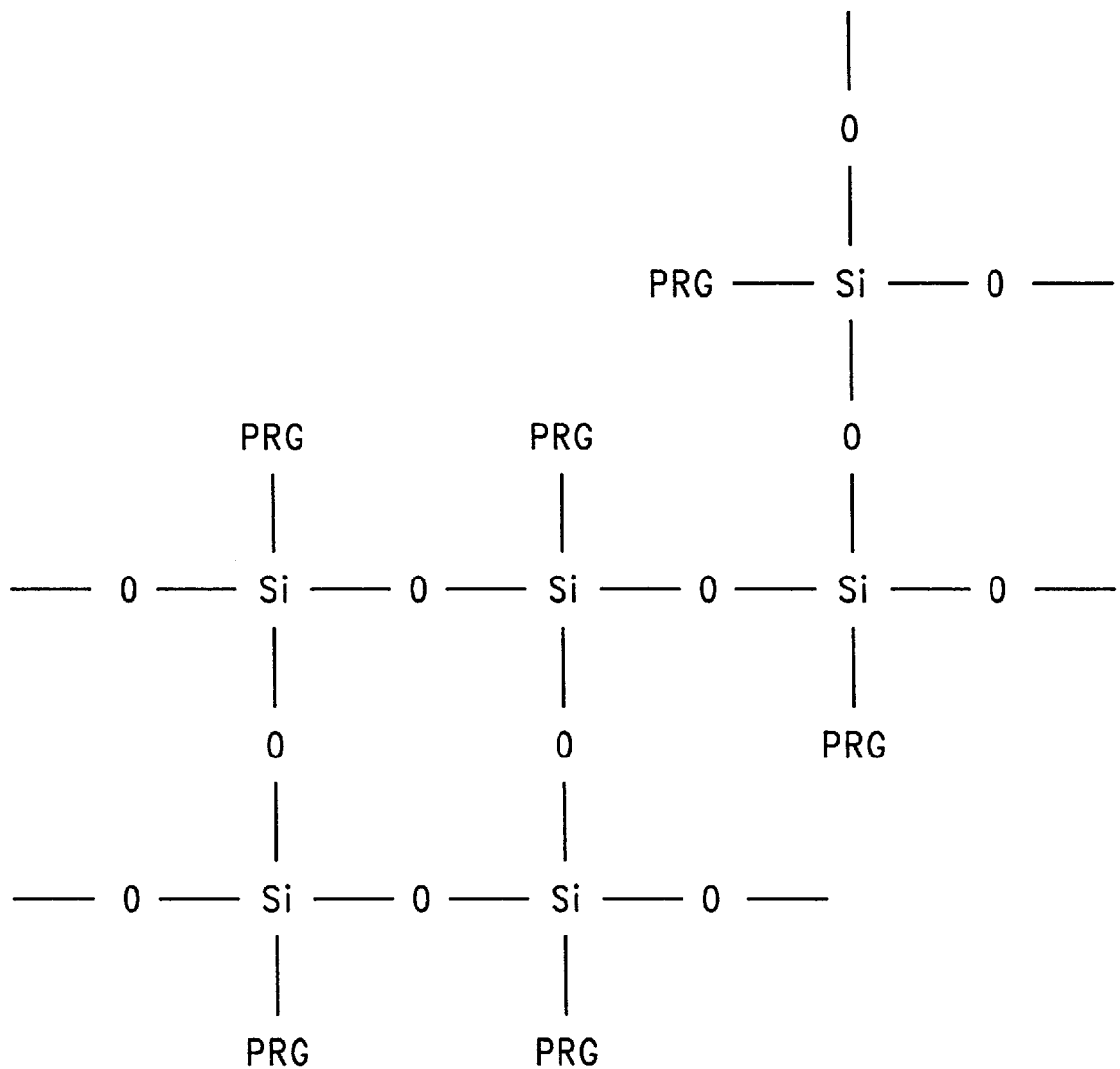

SPIN-ON DIELECTRIC FORMATION PROCESS FOR USE IN MANUFACTURING SEMICONDUCTORS

This is a continuation of application Ser. No. 07/568,120, filed Aug. 16, 1990 now abandoned.

BACKGROUND OF THE INVENTION

The present invention relates, in general to dielectrics used in manufacturing electronics, and more particularly to spin-on dielectrics for use in manufacturing semiconductors.

The use of spin-on dielectrics had previously been used in the semiconductor industry in the form of spin-on glass. These uses of spin-on glass was well known in the art of semiconductor processing. Spin-on glasses typically were made from organosilicon compounds and water, and were dissolved in an alcohol medium. The resulting polymers, called siloxanes, were liquids that could be applied to semiconductor wafers, spun to form a uniform coating, and cured to form an adhesive bond to a desired substrate. During curing, the siloxane polymer adhered to the substrate by forming a silicon-oxygen bond that was a glass. Consequently, they were called spin-on glass and were primarily used as dielectric materials. These previous spin-on glasses were limited by their high dielectric constant. When used to insulate conductors on a semiconductor chip, the high dielectric constant of these spin-on glasses produced capacitive loads on these conductors which degraded the performance of both high frequency and high density transistors. With semiconductor technology continually producing smaller transistors with correspondingly smaller output drive for these capacitive loads, the performance of transistors was degraded by the capacitance of spin-on glasses. Previous spin-on glasses had dielectric constants in excess of 3.8. Those with dielectric constants in the 3.8 range compared closely to silicon dioxide (approximately 3.9) but were still higher than other dielectrics such as polyimide (2.8–3.5) and, in extreme high frequency applications, air (1.0). Consequently these spin-on glasses were not suitable for use as a dielectric in many semiconductor applications.

Accordingly, it would be desirable to have a spin-on dielectric having a low dielectric constant.

SUMMARY OF THE INVENTION

The objects and advantages of the present invention are achieved by creating a spin-on dielectric that is a silicon based siloxane polymer wherein each silicon atom in the polymer is bonded to a polarization reducing group, and to three oxygen atoms each of which is bonded to one other silicon atom.

BRIEF DESCRIPTION OF THE DRAWINGS

The sole FIGURE is a graphical representation of the molecular structure of a portion of one polymer of the spin-on dielectric.

DETAILED DESCRIPTION OF THE DRAWINGS

The present invention provides a spin-on dielectric having a low dielectric constant that is suitable for use in manufacturing semiconductor devices. The low dielectric constant is obtained by the use of a siloxane polymer that has a very low polarization organic group added to reduce the polymer's polarization and consequently its dielectric constant.

The dielectric constant of a material is directly related to the polarization of its molecules. Materials with highly polarized molecules have higher dielectric constants than those with low polarization. It has been found that using materials with low polarization to produce spin-on dielectrics results in dielectric materials having a low dielectric constant. The aromatic family of organic compounds is one such group that has low polarization as one of its characteristics. Phenyl, bi-phenyl, and naphthalene are examples of aromatic groups. Aromatic groups are composed of rings of six carbon atoms, three of which contain carbon to carbon double bonds. The ring structure spreads out a group's atomic charges resulting in an organic group which has very low polarization. When attached to another compound, the charge spreading of the ring spreads the charge of the attached compound thereby functioning to decrease the compound's polarization. Consequently, the groups of the aromatic family are one example of polarization reducing groups that can be added to a material to reduce its polarization and thereby lower the material's dielectric constant.

Referring to the sole figure, the present invention provides a spin-on dielectric that is a siloxane polymer having a polarization reducing organic group bonded to every silicon atom in the polymer. The siloxane polymer is based on silicon (Si) atoms each of which has four bonds. One bond of every silicon atom is to the polarization reducing group (PRG). The other three bonds are to oxygen (O) atoms each of which is bonded to one other silicon atom. It has been found that the PRG group must be on every silicon atom in the polymer in order to reduce the polymer's dielectric constant. Formulation of the polymer is accomplished by mixing together an organosilane compound, water, a catalyst, and a solvent (such as alcohol, acetone, etc.). The organosilane compound has molecules that are composed of a four bond silicon atom having one bond to a polarization reducing group and three bonds to hydrolizable organic groups (ethoxy, methoxy, acetoxy, etc). When the formulation is mixed, the three hydrolizable groups on the silicon atoms are eventually replaced by oxygen atoms. Since oxygen atoms have two bonds, the oxygen atom's other bond is to another silicon atom in the mixture thereby creating the polymer having a molecular structure as shown in the sole FIGURE.

In one preferred embodiment, the polarization reducing group is an aromatic group and more specifically a phenyl group of the aromatic family. One of the organosilane compounds that can readily be formed with the phenyl group is phenyltriethoxysilane. This compound can be formulated to create a siloxane polymer having a phenyl group attached to every silicon atom in the polymer. The desired polyphenylsiloxane polymer is formulated by mixing phenyltriethoxysilane, which serves as the organosilane compound; ethanol, which serves as the solvent; hydrochloric acid, which serves as the catalyst; and water in the parts by weight as shown in the list below:

| | |
|---|---|
| phenyltriethoxysilane | 0.378 |
| ethanol | 0.546 |
| hydrochloric acid | 0.0004 |
| water | 0.0756 |
| Total | 1.0000 |

Although the composition by weight can vary from the formulation shown above, the main objective is to properly formulate the polymer to insure a phenyl group is attached to each silicon atom. The above formulation is one that achieves the desired polyphenylsiloxane polymer. The resulting polymer is represented by the chemical formula shown below:

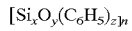

where:
C$_6$H$_5$=the phenyl group
Si=silicon
O=oxygen
x=z=1
y=1.5
n>>2

When this dielectric is cured on a semiconductor or another material, the phenyl group remains attached to its silicon atom thereby reducing the impact of the molecular polarization. After curing, this polyphenylsiloxane has a dielectric constant of approximately 2.4. Since the phenyl groups remain attached to the silicon atoms after curing, polyphenylsiloxane is a material between a glass and pure organic and possesses some of the characteristics of both. It has the hard film, and resistance to oxygen plasma etching characteristics of a spin-on glass along with the planarization, and low dielectric properties of an organic. These characteristics make it suitable as a spin-on dielectric for use in manufacturing semiconductors.

By now it should be appreciated that there has been provided a novel way to fabricate a spin-on dielectric having a low dielectric constant suitable for use in manufacturing semiconductors. The low dielectric constant provides a planarizing dielectric that does not degrade transistor performance. Consequently, polyphenylsiloxane is suitable for use as a dielectric in many semiconductor applications including manufacturing high speed bipolar and high frequency R.F. transistors, MOS MPUs, and many other semiconductors.

What is claimed is:

1. A method of forming a dielectric layer on a semiconductor wafer comprising:

providing a semiconductor wafer having a surface;

forming a mixture by combining ingredients consisting essentially of an organosilane compound having an aromatic group on every silicon atom, a solvent, a catalyst, and water; and forming the dielectric layer on the surface of the semiconductor wafer by curing the mixture on the surface so that the mixture forms a siloxane polymer having an aromatic group attached to every silicon atom of the polymer.

2. The method of claim 1 wherein forming the mixture includes using the water as approximately 0.0756 parts of the mixture by weight.

3. The method of claim 1 wherein forming the mixture includes using phenyltriethoxysilane as the organosilane.

4. The method of claim 3 wherein using phenyltriethoxysilane includes using phenyltriethoxysilane as approximately 0.378 parts of the mixture by weight.

5. The method of claim 1 wherein forming the mixture includes using alcohol as the solvent.

6. The method of claim 1 wherein forming the mixture includes using ethanol as the solvent.

7. The method of claim 6 wherein using ethanol includes using ethanol as approximately 0.546 parts of the mixture by weight.

8. The method of claim 1 wherein forming the mixture includes using hydrochloric acid as the catalyst.

9. The method of claim 8 wherein using hydrochloric acid includes using hydrochloric acid as 0.0004 parts of the mixture by weight.

10. A method of providing a dielectric on a semiconductor wafer comprising:

providing a semiconductor wafer; and forming a dielectric layer on the semiconductor wafer wherein the dielectric is a siloxane polymer and wherein each silicon atom in the polymer has a single aromatic group attached to it.

11. A method of providing a dielectric on a semiconductor wafer comprising:

providing a semiconductor wafer; and forming a dielectric layer having a dielectric constant no greater than approximately 2.4 on the semiconductor wafer wherein the dielectric is a siloxane polymer and wherein each silicon atom in the polymer has a group selected from the aromatic family attached to it.

* * * * *